(12) United States Patent
Gary

(10) Patent No.: US 11,013,141 B2
(45) Date of Patent: May 18, 2021

(54) DECOUPLED CONDUCTION/CONVECTION DUAL HEAT SINK FOR ON-BOARD MEMORY MICROCONTROLLERS

(71) Applicant: Microsoft Technology Licensing, LLC, Redmond, WA (US)

(72) Inventor: Brandon Gary, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/510,314

(22) Filed: Jul. 12, 2019

(65) Prior Publication Data

US 2020/0383232 A1     Dec. 3, 2020

Related U.S. Application Data

(60) Provisional application No. 62/855,544, filed on May 31, 2019.

(51) Int. Cl.
   *H05K 7/20* (2006.01)
   *G06F 1/20* (2006.01)

(52) U.S. Cl.
   CPC .......... *H05K 7/20127* (2013.01); *G06F 1/20* (2013.01); *H05K 7/20154* (2013.01); *H05K 7/20509* (2013.01); *H05K 7/20336* (2013.01)

(58) Field of Classification Search
   CPC .......... H05K 7/20127; H05K 7/20154; H05K 7/20509; H05K 7/20336; G06F 1/20
   See application file for complete search history.

(56) References Cited

U.S. PATENT DOCUMENTS

| | | | | |
|---|---|---|---|---|
| 7,286,361 B2* | 10/2007 | Yamanaka | ............ | H01L 23/367 165/185 |
| 7,719,831 B2* | 5/2010 | Fujiwara | ................. | G06F 1/203 165/104.21 |
| 8,619,426 B2* | 12/2013 | Chamseddine | ....... | F28D 7/0075 165/104.33 |
| 9,405,335 B1 | 8/2016 | Boilard et al. | | |

(Continued)

OTHER PUBLICATIONS

"International Search Report and Written Opinion Issued in PCT Application No. PCT/US2020/029989", dated Jul. 14, 2020, 11 Pages.

*Primary Examiner* — Abhishek M Rathod
*Assistant Examiner* — Keith DePew
(74) *Attorney, Agent, or Firm* — Arent Fox LLP

(57) ABSTRACT

A heat sink may include a base having a first surface in a first plane configured to contact a system on chip (SoC) located on a circuit board. The heat sink may include a plurality of heat transfer members connected to and extending from the base. The plurality of heat transfer members are configured to extend along a longitudinal length in a second plane having a first spacing from the first plane. The plurality of heat transfer members respectively include opposing internal walls that define a second spacing between the plurality of heat transfer members. The heat sink may include an enclosure surrounding the plurality of heat transfer members. The enclosure may include a base plate that contacts the base of the heat sink to form a cold-plate. The enclosure may partially surround the length of the heat transfer members, allowing airflow through the enclosure in a cross direction.

16 Claims, 11 Drawing Sheets

(56) References Cited

U.S. PATENT DOCUMENTS

| | | | |
|---|---|---|---|
| 9,788,460 B2* | 10/2017 | Barron | H05K 7/20509 |
| 10,645,825 B1* | 5/2020 | Hurt | H01Q 1/24 |
| 2011/0063801 A1* | 3/2011 | Lin | H05K 5/0213 |
| | | | 361/705 |
| 2014/0240918 A1* | 8/2014 | Damaraju | G06F 1/20 |
| | | | 361/679.47 |
| 2014/0306335 A1* | 10/2014 | Mataya | H01L 23/367 |
| | | | 257/713 |
| 2015/0035135 A1* | 2/2015 | Hung | H01L 23/36 |
| | | | 257/712 |
| 2015/0043167 A1* | 2/2015 | Guenin | H01L 23/3672 |
| | | | 361/719 |
| 2015/0043168 A1 | 2/2015 | Douglas et al. | |
| 2015/0153113 A1* | 6/2015 | Glover | F28F 3/048 |
| | | | 361/692 |
| 2015/0285573 A1* | 10/2015 | Stellman | G06F 1/20 |
| | | | 361/679.54 |
| 2016/0021791 A1* | 1/2016 | Bosak | F28D 15/04 |
| | | | 165/104.21 |
| 2016/0286099 A1* | 9/2016 | Godil | H04N 5/2252 |
| 2017/0164520 A1* | 6/2017 | Barron | G06F 1/20 |
| 2017/0186667 A1* | 6/2017 | Choudhury | H01L 23/473 |
| 2018/0158755 A1* | 6/2018 | Ritter | H01L 23/4093 |
| 2018/0341298 A1 | 11/2018 | Cheng et al. | |
| 2019/0043779 A1* | 2/2019 | Chung | G06F 1/20 |
| 2019/0045663 A1 | 2/2019 | Shia et al. | |
| 2019/0059177 A1* | 2/2019 | Chu | G06F 1/203 |
| 2019/0074252 A1* | 3/2019 | Chigullapalli | H05K 9/0032 |
| 2019/0139855 A1* | 5/2019 | MacDonald | H01L 23/3675 |
| 2019/0189532 A1* | 6/2019 | Huttunen | H05K 1/0209 |
| 2019/0206839 A1* | 7/2019 | Balakrishnan | H01L 25/50 |
| 2019/0252286 A1* | 8/2019 | Peterson | H01L 23/4006 |
| 2020/0008321 A1* | 1/2020 | Marcoccia | H05K 7/20336 |
| 2020/0015385 A1* | 1/2020 | Bucher | G06F 1/20 |
| 2020/0096923 A1* | 3/2020 | Kawashima | G03G 15/80 |
| 2020/0100386 A1* | 3/2020 | Saturley | G02B 6/4269 |
| 2020/0111720 A1* | 4/2020 | Wan | H01L 25/50 |
| 2020/0194420 A1* | 6/2020 | Scobee | H05K 1/0203 |

* cited by examiner

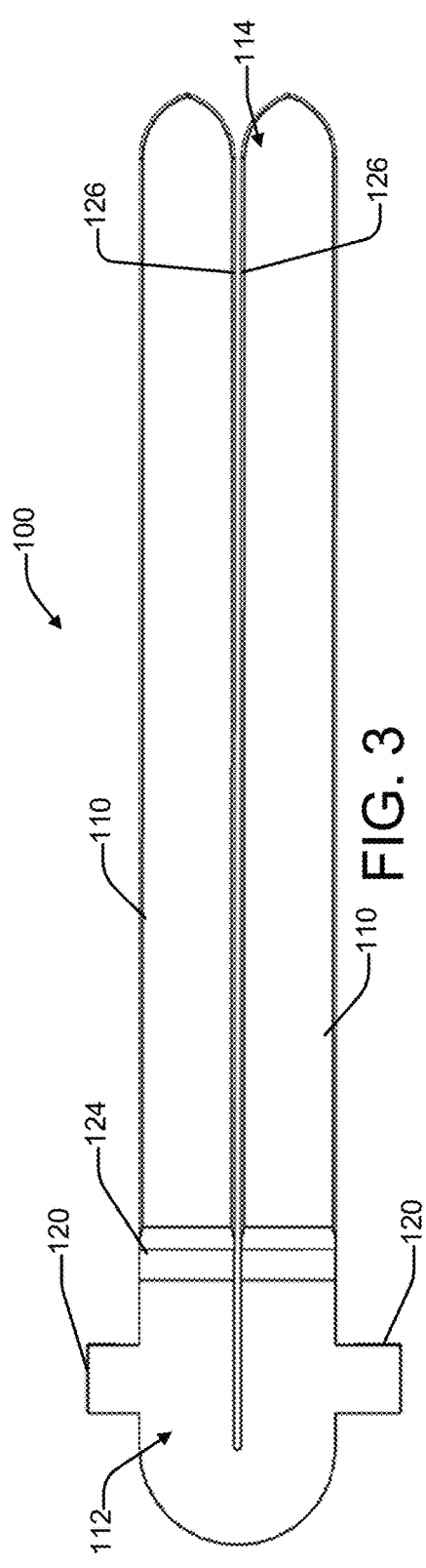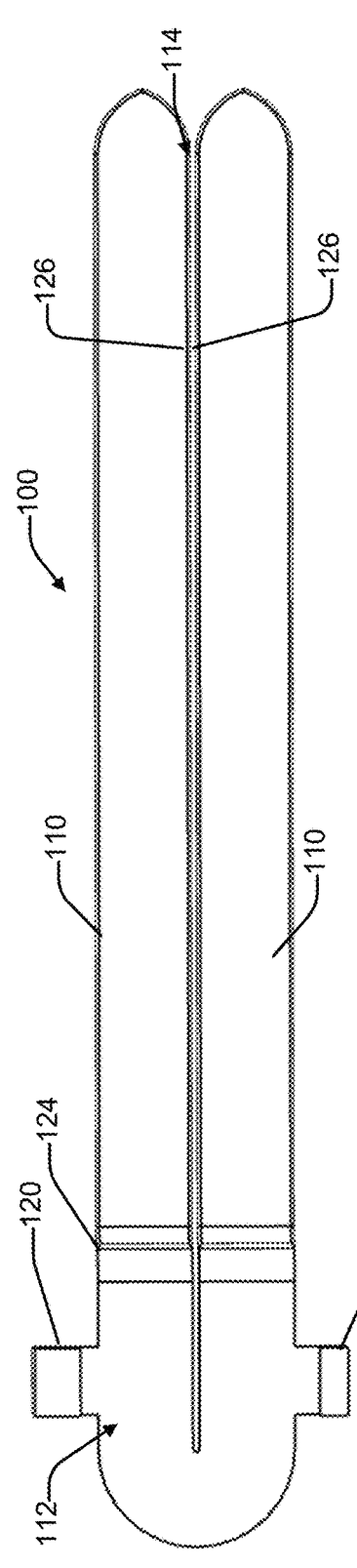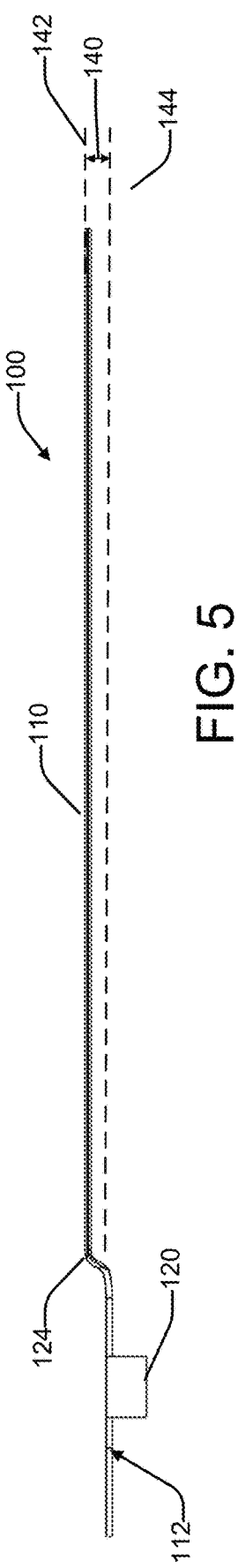

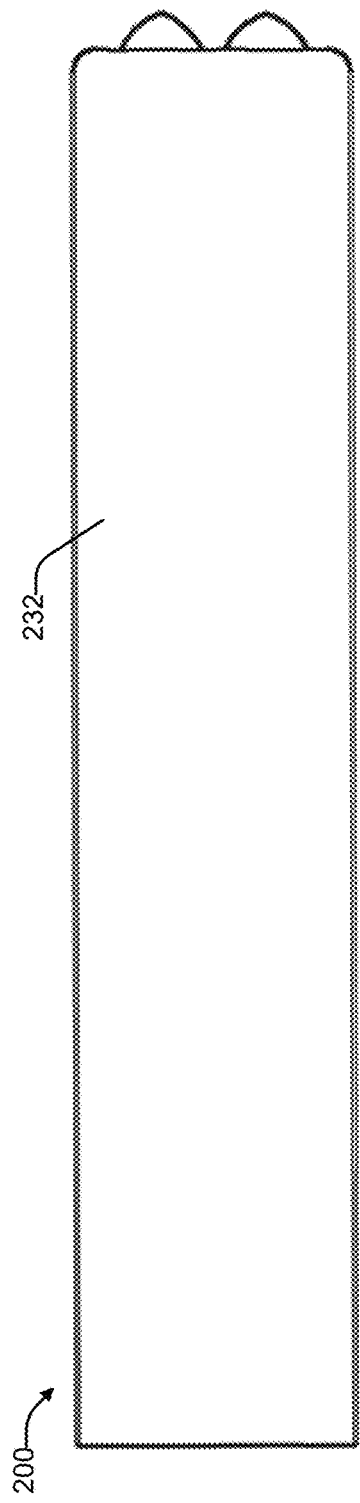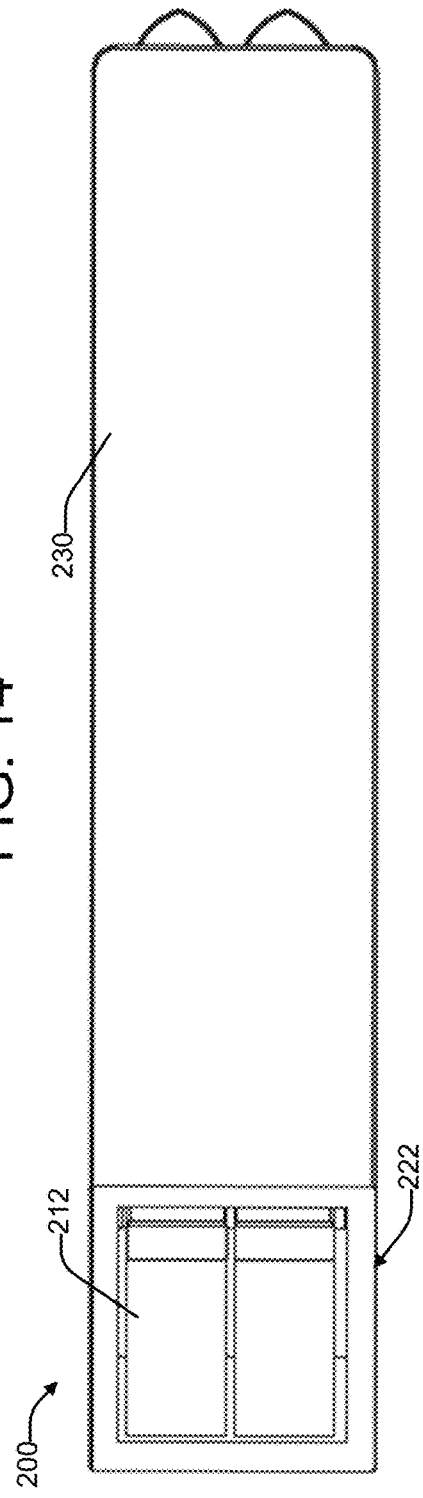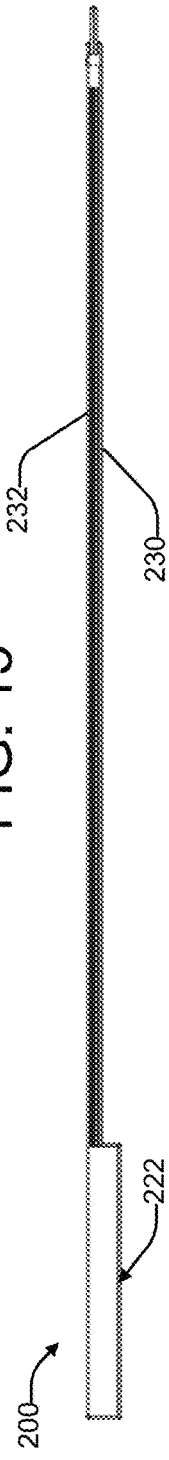
FIG. 14
FIG. 15
FIG. 16

DECOUPLED CONDUCTION/CONVECTION DUAL HEAT SINK FOR ON-BOARD MEMORY MICROCONTROLLERS

CLAIM OF PRIORITY UNDER 35 U.S.C. § 119

This application claims priority to U.S. Provisional Application No. 62/855,544 titled "DECOUPLED CONDUCTION/CONVECTION DUAL HEAT SINK FOR ON-BOARD MEMORY MICROCONTROLLERS," filed May 31, 2019, which is assigned to the assignee hereof, and incorporated herein by reference in its entirety.

BACKGROUND

The present disclosure relates to cooling systems, and more particularly, to cooling systems for electronic devices.

Cooling systems for electronic devices such as computers often include a fan that moves air over various components to remove heat generated by the components. As part of having the fan move the warm air, it is likely that the air warmed by one component may be passed over another component; air passed over the other component will be "pre-heated." Increasing "pre-heated" or component inlet air temperature reduces the cooling capability of the downstream component as shown by the heat transfer internal flow equation when compared to the upstream components. Accordingly, to address some of these issues, there is a need for improved mechanisms for controlling heat generated by a computing device.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its purpose is to present some concepts of one or more implementations in a simplified form as a prelude to the more detailed description that is presented later.

In an aspect, the disclosure provides a heat sink. The heat sink may include a base having a first surface in a first plane configured to contact a system on chip (SoC) located on a circuit board. The heat sink may include a plurality of heat transfer members connected to and extending from the base, wherein the plurality of heat transfer members are configured to extend along a longitudinal length in a second plane having a first spacing from the first plane, and wherein the plurality of heat transfer members respectively include opposing internal walls that define a second spacing between the plurality of heat transfer members.

In an aspect, the heat sink may further include a plurality of arms each extending from opposite sides of the base, each arm having a shape to define a clip configured to attach with the circuit board.

In an aspect, the plurality of heat transfer members include a connector portion proximate the base, wherein the connector portion is sized to define the first spacing between the second plane of the plurality of heat transfer members and the first plane of the first surface of the base. The connector portion may be bent at an inflection point.

In an aspect, the first surface of the base has a first surface area greater than a second surface area of a corresponding surface of the SoC.

In an aspect, the heat sink further includes a thermal adhesive configured to attach the base to the SoC.

In an aspect, the heat sink further includes an enclosure at least partially surrounding the plurality of heat transfer members. The enclosure may include a base plate that contacts the base at a second surface opposite the first surface of the base. The base plate and base may form a cold plate of the heat sink. The enclosure may include a proximal panel positioned on a first side of the plurality of heat transfer members and configured to face the circuit board, a distal panel on a second side of the plurality of heat transfer members, wherein the second side is opposite from the first side, and wherein the proximal panel and the distal panel both longitudinally extend from respective near ends adjacent to the base to respective far ends away from the base, wherein the respective far ends define an opening at an end of the heat transfer members. The enclosure may include one or more internal side walls that define one or more side vents between the proximal panel and the distal panel. The heat transfer members may have a greater heat conductivity than the enclosure.

In an aspect, the disclosure provides a computer system. The computer system may include a printed circuit board including a SoC and at least one additional component. The computer system may include a heat sink including a base attached to a surface of the SoC in a first plane, the heat sink further including a plurality of heat transfer members connected to and extending from the base, wherein the plurality of heat transfer members are configured to extend along a longitudinal length in a second plane having a first spacing from the first plane, and wherein the plurality of heat transfer members respectively include opposing internal walls that define a second spacing between the plurality of heat transfer members.

In an aspect, the computer system may further include an air source configured to move air from an end of the plurality of heat transfer members toward the SoC.

In an aspect, the printed circuit board is a memory microcontroller card.

Additional advantages and novel features relating to implementations of the present disclosure will be set forth in part in the description that follows, and in part will become more apparent to those skilled in the art upon examination of the following or upon learning by practice thereof.

BRIEF DESCRIPTION OF THE DRAWINGS

The specific features, implementations, and advantages of the disclosure will become better understood with regard to the following description, appended claims, and accompanying drawings where:

FIG. 3 is a top plan view of the implementation of the heat sink of FIG. 1.

FIG. 4 is a bottom plan view of the implementation of the heat sink of FIG. 1.

FIG. 5 is a front view of the implementation of the heat sink of FIG. 1.

FIG. 14 is a top plan view of the implementation of the heat sink of FIG. 9.

FIG. 15 is a bottom plan view of the implementation of the heat sink of FIG. 9.

FIG. 16 is a front view of the implementation of the heat sink of FIG. 9.

DETAILED DESCRIPTION

Figure 1:
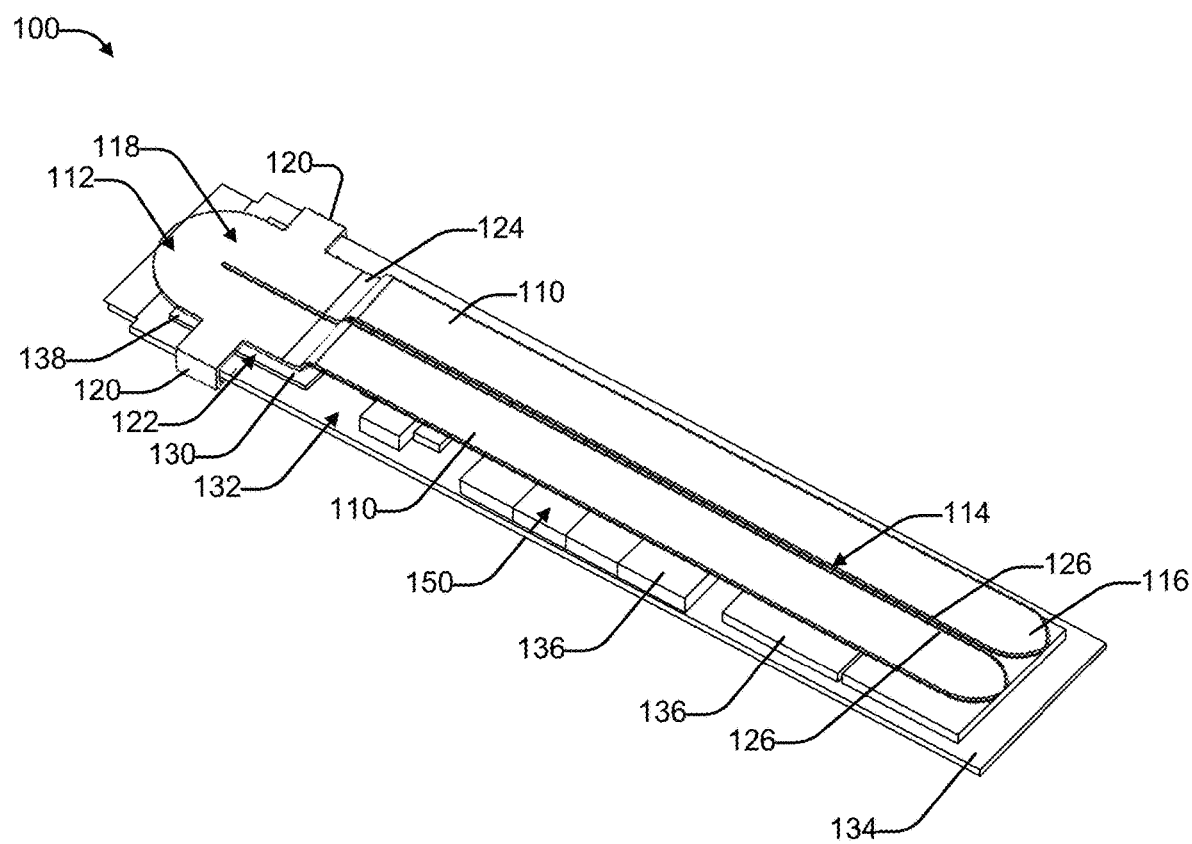
FIG. 1 is a top right perspective view of an example heat sink mounted on a circuit board and in contact with a heat generating component, such as a system on chip (SoC).
Figure 2:
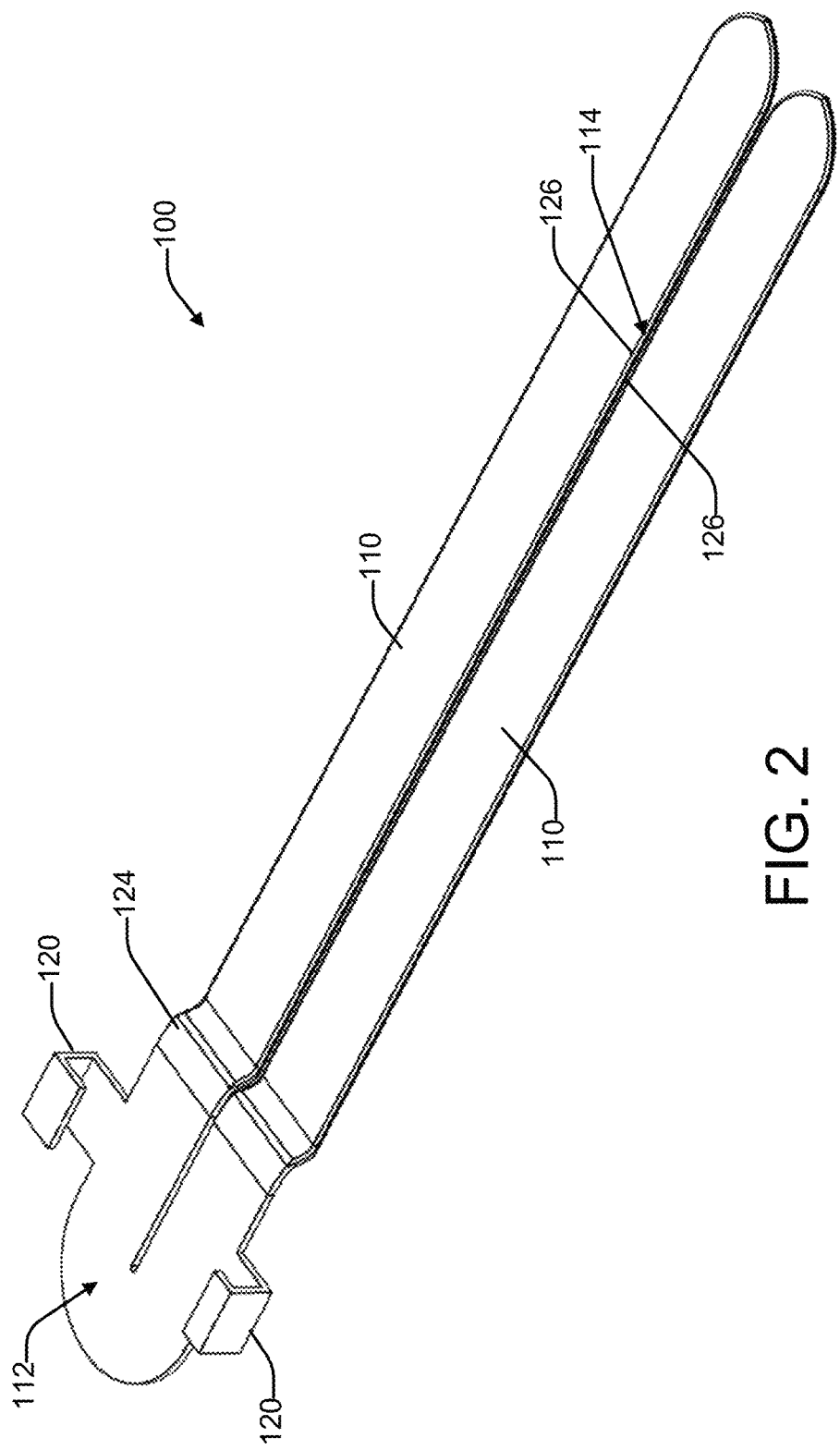
FIG. 2 is a bottom right perspective view of the implementation of the heat sink of FIG. 1.
Figure 6:
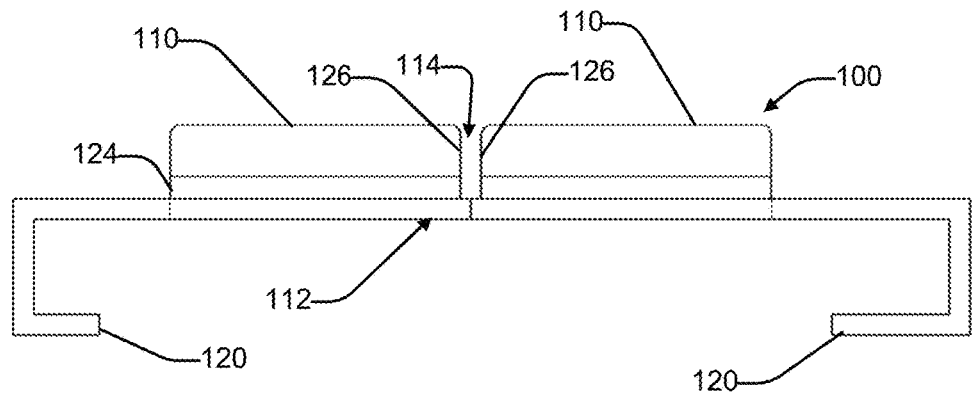
FIG. 6 is a left side view of the implementation of the heat sink of FIG. 1.
Figure 7:
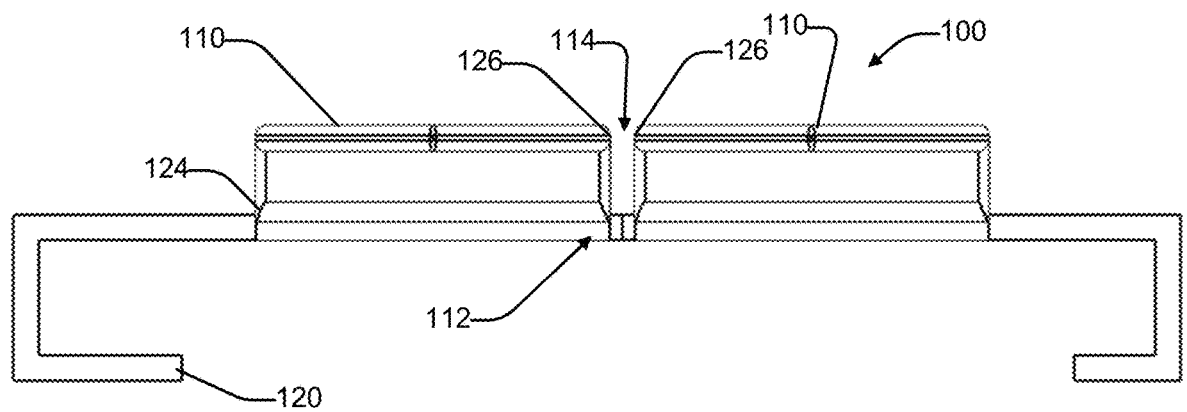
FIG. 7 is a right side view of the implementation of the heat sink of FIG. 1.
Figure 8:
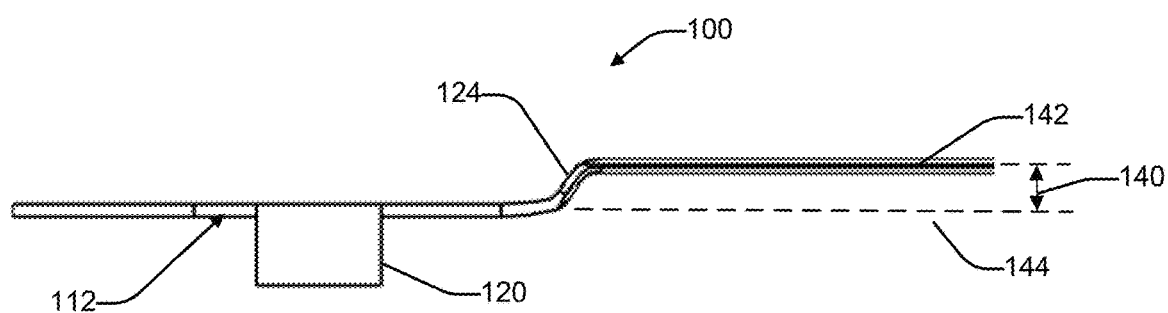
FIG. 8 is a partial cut-away front view of a left side of the implementation of the heat sink of FIG. 2
Figure 9:
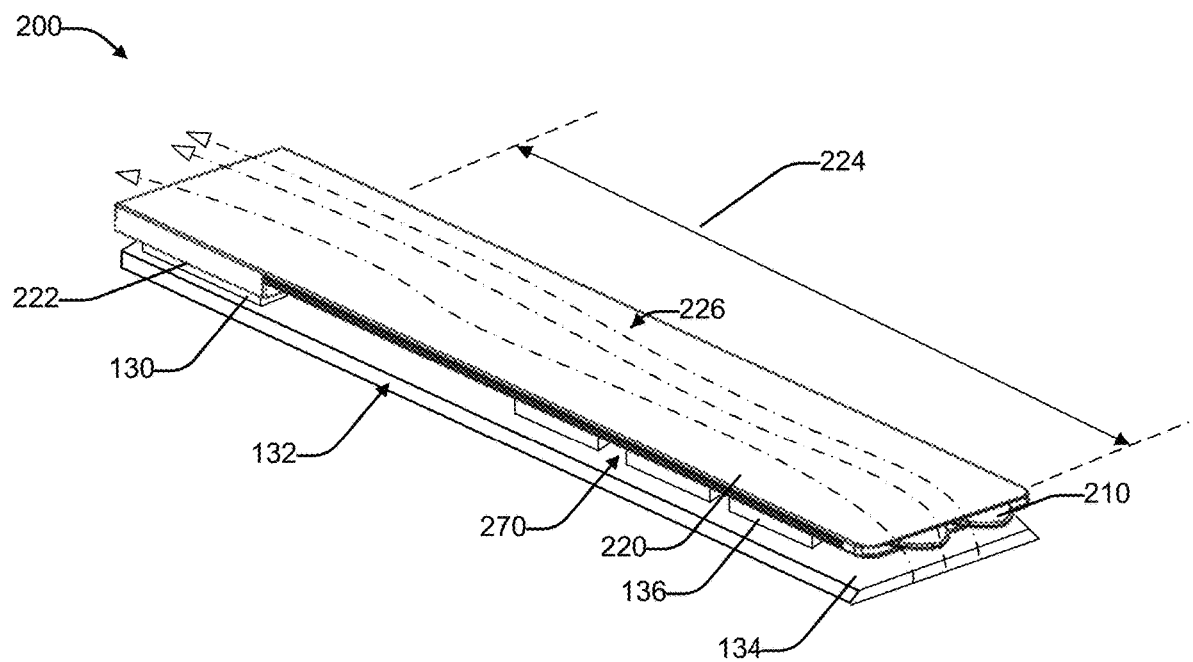
FIG. 9 is a top right perspective view of another implementation of the heat sink of FIG. 1, with the heat sink further including an enclosure, and including arrows representing airflow around the heat sink.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts. In some implementations, examples may be depicted with reference to one or more components and one or more methods that may perform the actions or operations described herein, where components and/or actions/operations in dashed line may be optional.

Microcontrollers are producing greater amounts of heat and becoming harder to cool. Additionally, microcontroller may have Peripheral Component Interconnect Express (PCI-e) specification requirements to meet. These controllers are responsible for NAND and double data rate (DDR) operations that are increasing in workload demands. Traditional base and fin heat sinks are too large to employ as a solution for these types of architectures. Folded heat sinks do not have the fin-to-base height efficiency of traditional heat sinks and can cause pre-heated turbulent air to increase local ambient temperature and reduce the amount of energy that can be transferred from the package.

The present disclosure provides a heat sink including a plurality of heat transfer members, such as two positioned side-by-side, that extend from a base or cold-plate, which may be in contact with or configured to contact a system on chip (SoC). The plurality of heat transfer members may extend over all or a portion of a package, which may include a printed circuit board and components thereon. There may be a spacing between the plurality of heat transfer members and the package such that the plurality of heat transfer members do not contact the printed circuit board or the components thereon. In an implementation, the heat sink may additionally include an enclosure surrounding the plurality of heat transfer members. The enclosure may form the base or cold-plate, or a portion thereof. The enclosure may surround all or a portion of the length of the heat transfer members, and may include open ends to allow airflow through the enclosure.

Referring to FIGS. 1-8, an example heat sink 100, includes a plurality of heat transfer members 110, which can be mounted to a package 132 to remove thermal energy, or heat, from the package 132. For example, in an implementation, the heat sink 100 may include mating arms 120 and/or a thermal adhesive 122 to enable the mounting of the heat sink 100 with the package 132. The package 132 may include a printed circuit board (PCB) 134 and components 136 thereon. A system-on-chip (SoC) 130 may be a particular component 136 of the package 132 that generates heat and requires cooling. For example, the package 132 may be a memory card including a memory card controller SoC. The SoC 130 may include a surface 138, which the heat sink 100 contacts.

The heat sink 100 may include a base 112 configured to contact a heat-generating one of the components 136 (e.g., the SoC 130) of the package 132. The base 112 may have a base surface 118 with a surface area that is greater than a surface area of the corresponding contacted surface 138 of the SoC 130. The base surface 118 is sized to be in contact with the SoC 130 so that heat may be conducted into the heat sink 100 via the base 112. The base 112 may be formed of a same or a different material as the plurality of heat transfer members 110. Suitable materials for forming the base 112 include, but are not limited to, copper alloys and aluminum alloys.

In some implementations, the thermal adhesive 122 may be located between the SoC 130 and the base 112 in order to improve or maintain thermal contact between the SoC 130 and the base 112 to allow conduction. The thermal adhesive 122 may include, but is not limited to, a thermally conductive material, such as a metal, a metal oxide, silica or ceramic microspheres, carried by an epoxy resin, a paste, or a double-sided tape.

In an aspect, the mating arms 120 may extend from opposite sides of the base 112 and may have a shape that enables clipping or connecting the heat sink 100 to the printed circuit board 134. For example, in one implementation, each mating arm 120 may extend to an edge of the printed circuit board 134 and bend around the printed circuit board 134 to retain the heat sink 100 on the package 132. For example, each mating arm 120 may include two approximately right angles, and a height between opposing internal surfaces (e.g., internal top surface and the opposing internal bottom surface) of each mating arm 120 may be at least a height of the printed circuit board 134 and the SoC 130. It should be appreciated that the shape of the mating arms 120 may be adapted to the dimensions of a particular package.

The heat transfer members 110 may include planar bodies that longitudinally extend from the base 112 along all or a portion of a length of the package 132. For example, the heat transfer members 110 may extend to an end of a last component 136 (e.g., closest to an end of the printed circuit board 134 that is opposite the base 112) or to an end of the printed circuit board 134 that is opposite the base 112.

The heat transfer members 110 include a connector portion 124 proximate the base 112, wherein the connector portion 124 connects the heat transfer members 110 to the base 112. In an implementation, the connector portion 124 is sized to define a spacing 140 between a plane 142 in which the heat transfer members 110 extend and a plane of the surface 144 of the base 112. The spacing 140 enables the heat transfer members 110 to extend without interfering with the components 136 while maintaining a relatively low profile, and provides a gap that may allow cooling airflow. For instance, the heat transfer members 110 may have a thickness (e.g., a vertical thickness in FIG. 1) of about 1 mm, or more preferably of about 0.5 mm, which results in the low profile. The connector portion 124 illustrated in FIG. 1 forms a curved member with an inflection point, but other shapes (e.g., a member normal to the base 112 and the heat transfer members 110, an angled member, etc.) may be utilized depending on the application.

The heat transfer members 110 may include opposing internal walls 126 that define a spacing 114 that increases the thermal transfer capabilities of the heat transfer members 110. For example, the internal walls 126 increase a thermal transfer surface area, and the spacing 114 may allow airflow between the heat transfer members 110. For example, in one implementation, the spacing 114 may be between 0.2 mm and 2 mm, preferably about 0.5 mm. Conduction (heat transfer through a solid) may be given by the following equation:

$$Q = kA\frac{dT}{dX}$$

where: Q (Watts (W)) refers to power or heat dissipation; k (W/m-K) refers to the conduction coefficient of the material (e.g., copper, heat pipe, etc.); A (m$^2$) refers to area (thickness x width); dT (° C.) refers to the temperature change between the coolest and warmest areas of the conducting matter; and dX (m) refers to the length of heat traveled. Accordingly, increasing the width of the conducting matter (metal, heat pipe, etc.) allows for increased conduction through that matter. However, increasing surface area will increase the air being trapped between the package 132 and the heat sink 100.

Meanwhile, convection (heat transfer through air, water, or other medium) may be defined by the following equation:

$$Q=hA(dT)$$

where Q (Watts(W)) refers to power or heat dissipation; h (W/m$^2$-K) refers to the convective coefficient of air (assume 50-200); and dT refers to the temperature change of air and surface being analyzed, which may be the top of the heat transfer members 110, to the top of the package measured as rectangle. Additionally, a Nusselt number may define the balance of heat being transferred via conduction or convection as hL/k. Accordingly, the width of the spacing 114 may be tuned to optimize cooling by conduction and convection for a specific design.

The heat transfer members 110 may be formed of a same or a different material as the base 112. Suitable materials for forming the heat transfer members 110 include, but are not limited to, copper alloys, aluminum allows, stainless steel, copper, a vapor chamber, a heat pipe device, or any thermally conductive material or mechanism. The thermal conductivity of the conducting material may be determined by the density of the molecular structure of the metal and/or the internal fluid phase contained in a metal enclosure. "Density of the molecular structure" may refer to a solid in which energy is being transfer through a solid metal bar itself (e.g., when the heat transfer members 110 are solid. "Internal fluid phase" refers to the two-phase vapor process that occurs in both heat pipes and vapor chambers. For example, in the case of being a heat pipe device, the heat transfer members 110 may be a sealed tube including a liquid. Heat from the base 112 may cause the liquid to evaporate and travel to the end 116, where the liquid condenses and travels back to the base 112. Further for example, in the form of a planar metal, the heat transfer members 110 may conduct heat from the base 112 toward the ends 116. Accordingly, in any form, the heat transfer members 110 may effectively increase conduction of heat from the base 112 to the ends 116.

The heat sink 100 may have a unitary construction including the base 112, the heat transfer members 110 and/or the mating arms 120. For example, a thermally-conductive material blank may be stamped to form the edges of the base 112, heat transfer members 110, and mating arms 120. In an aspect where a specific heat pipe device or vapor chamber is used for the heat transfer members 110, the heat transfer members 110 may be welded to the base 112. In one implementation, the mating arms 120 may be bent to curve around a package 132 as described above. For instance, in this case, the mating arms 120 may be bent at a first inflection point in a direction normal to the package 132, then bent at a second inflection point in a direction toward and parallel to the package 132.

The heat transfer members 110 work in conjunction with the base 112 to increase energy dissipation into local ambient air and improve cooling capacity. The heat sink 100 allows the memory card to be positioned in various orientations as the low profile of the heat sink 100 matches a shape of the package 132, and the increase in height may be within PCI-e standards. In an aspect, the heat sink 100 may provide up to 50% improvement in cooling solutions with minimal impact to airflow impedance, according to simulations. The heat sink 100 may reduce latent heat transfer to upstream components that occurs with traditional heat sinks and mating solutions. For example, by limiting airflow over the other components 136 toward the SoC 130, the heat transfer members 110 may prevent the component 136 from pre-heating the air contacting the base 112.

In an implementation, the heat sink 100 used on a microcontroller may increase the cooling capacity for memory cards. The heat sink 100 may mate to the printed circuit board (PCB) 134 without needing mating features added to the board and can be configured in a variety of heat pipe and vapor chamber architectures. The heat sink 100 may be able to cool memory components that are oriented in either vertical or horizontal placements in spatially constrained regions of the system. Spatial constraints result in high power memory components not being afforded the same airflow boundary layer development as other components (e.g., CPUs). Accordingly, memory components suffer from reduced convection cooling. This design considers the reduced cooling capacity of air by providing increased conductive cooling on the package 132 without creating high airflow impedance that would impact system airflow. In addition the design implements mating techniques that are universally applicable to memory card architectures and PCI-e requirements.

Some advantages of the heat sink 100 over traditional heat sinks is that the heat sink 100 is not bulky and can be fit into tight spaces within many computer platforms. The heat sink 100 allows for multiple component orientations regardless of airflow direction. Other advantages include compactness, ability to drive energy into cooler ambient air, and a universal mating architecture.

Lastly, other heat sink designs couple heat from surrounding components 136 by mounting one "block" type of heat sink, which increases latent heat to surrounding components and decreases cooling capacity. In contrast, the relatively thin and relatively long architecture of the heat transfer members 110, along with the spacings 114 and 150 that allow cooling airflow, in the heat sink 100 decouples higher heat flux components from lower heat flux components, allowing increased conduction for the higher temperature on-board packages and optimal airflow for the lower power on-board packages.

Referring to FIGS. 9-19, another example heat sink 200, which may be similar to the heat sink 100 of FIG. 1, additionally includes an enclosure 220 around a plurality of heat transfer members 210 that are similar to the heat transfer members 110 of the example heat sink 100. For example, the heat transfer members 210 may be manufactured in the same manner, or formed of the same materials or mechanisms, as the heat transfer members 110. Referring to an example of the right-to-left airflow 226 around the heat sink 200, in FIG. 9, the enclosure 220 may reduce warming of the air prior to the air reaching the SoC 130 by isolating the heat transfer members 110. Similar to the heat sink 100 of FIG. 1, the spacing 270 between the PCB 134 and the heat transfer members 210 allows cross-section airflow and allows the heat sink 200 to be used in various orientations. The heat transfer members 210 may contact the enclosure 220 at an SoC mating point (e.g., a cold plate 222, where a base 212 to which the heat transfer members 210 are connected is located within the enclosure 220), but the heat transfer members 210 may be decoupled from the enclosure 220 through an airflow region 224. In other words, and additionally referring to FIG. 10, the heat transfer members 210 are spaced apart from the enclosure 220 by a spacing 242 along a length defined by the airflow region 224. The spacing 242 is defined between an inner surface 234 of a distal panel 232 of the enclosure 220 and a top surface 218 of the heat transfer members 210, as well as between an inner surface 231 of a proximal panel 230 of the enclosure 220 and a bottom surface 219 of the heat transfer members 210. The spacing 242 above and below the heat transfer members 210 may be the same or may be different.

Figure 11:
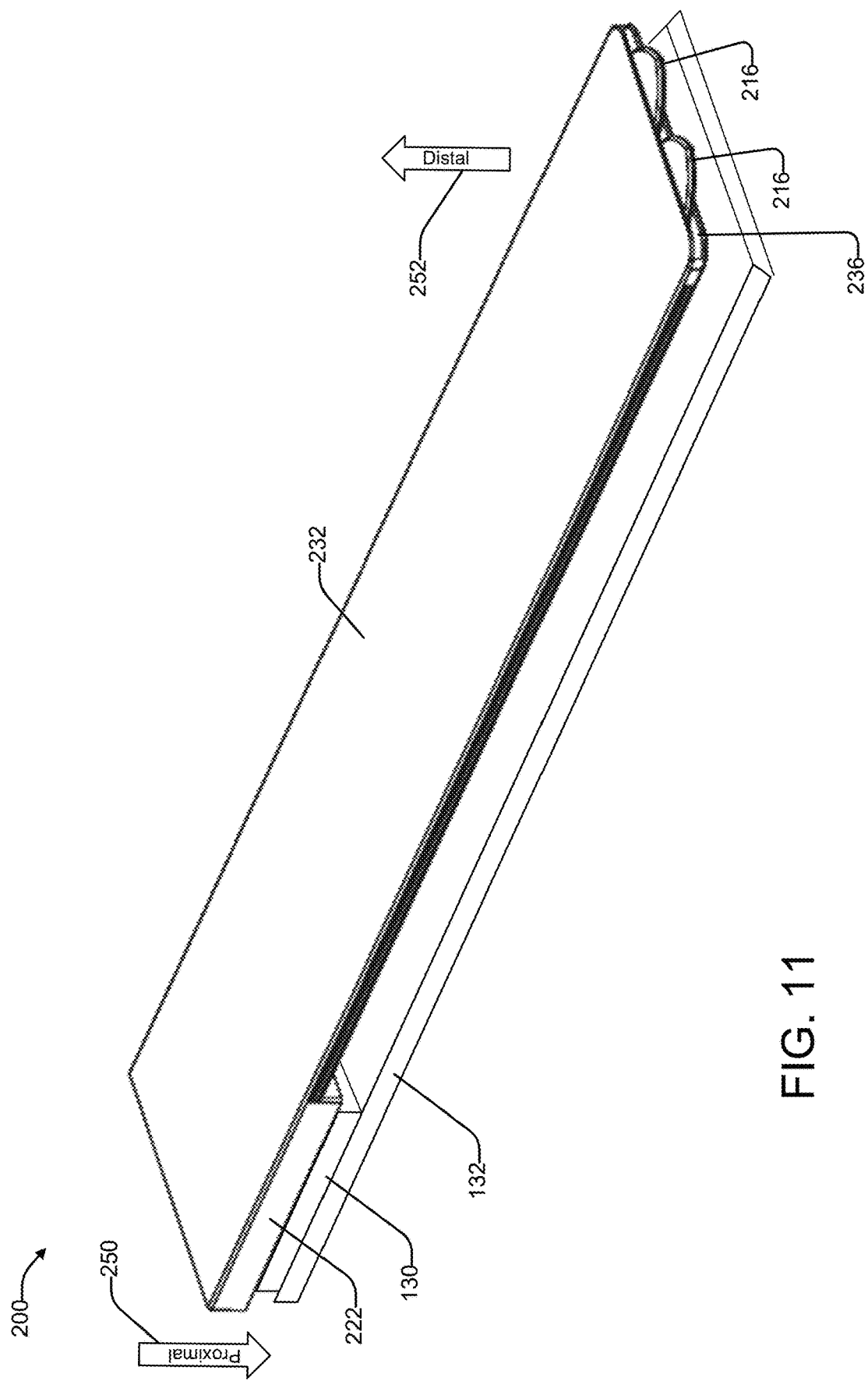
FIG. 11 is a top right perspective view of the implementation of the heat sink of FIG. 9.

Referring to FIG. 11, the proximal direction 250 and distal direction 252 with respect to the package 132 are shown. Since the example heat sink 200 may be positioned in various orientations, directions may be defined with respect to the package to which the example heat sink 200 is to be attached. As used herein, absolute directions (e.g., top, bottom) refer to the orientation shown in FIG. 1 and FIG. 9 with the heat sink 100, 200 on top of a horizontally oriented package 132.

Figure 10:
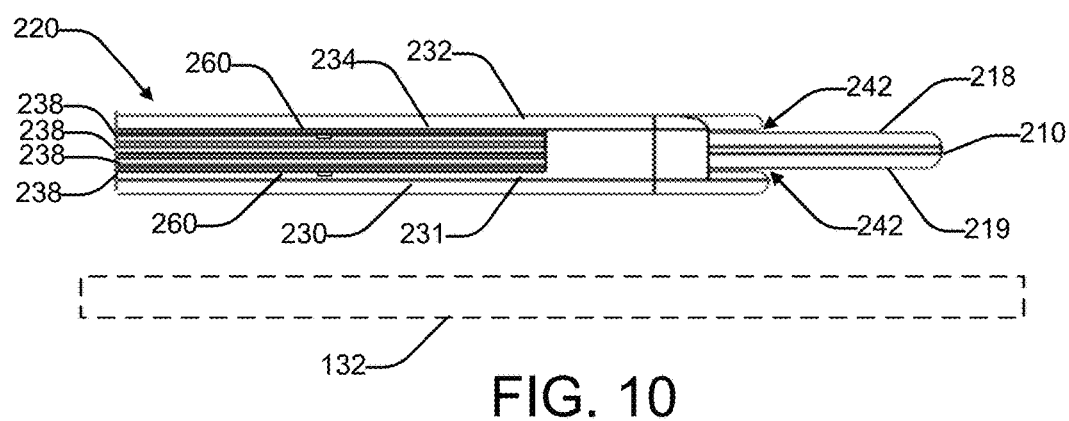
FIG. 10 is a close-up, partial front view of a right side portion of the heat sink of FIG. 2, including heat transfer members visible from vents in, and extending from and end of, the enclosure.

Referring to FIG. 10, which provides a more detailed view of the airflow boundary region 224, the enclosure 220 may include the proximal panel 230 that is close to the package 132 and the distal panel 232 that is opposite the package 132. The enclosure 220 may further include vents 238 between the proximal panel 230 and the distal panel 232, at both a front and back side, that allow a cross-flow (e.g., front to back) of air to pass to the heat transfer members 210, as compared to the right-to-left airflow 226 illustrated in FIG. 2. Additionally, the vents 238 may provide an increased surface area of the enclosure 220 to improve convection.

Figure 12:
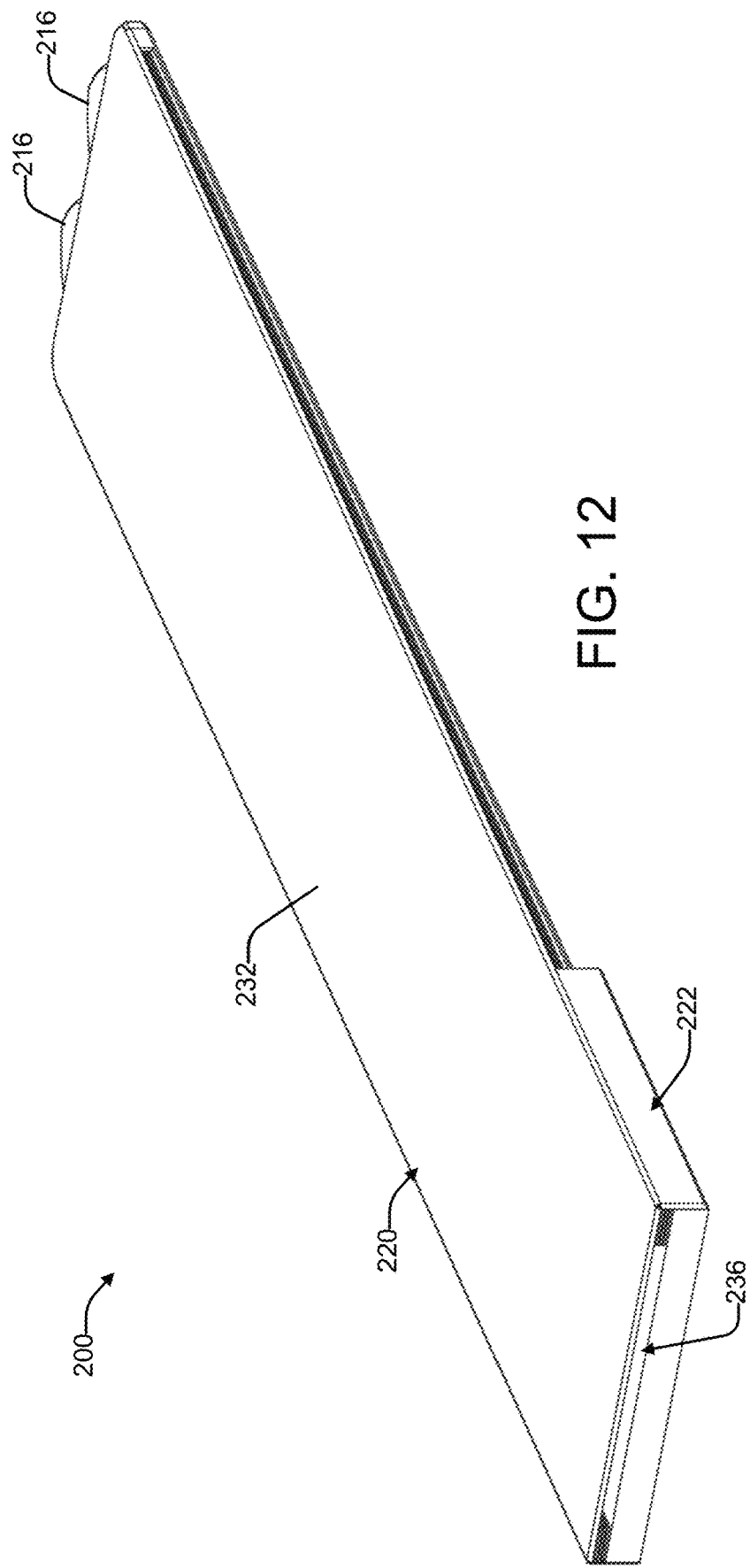
FIG. 12 is a top left perspective view of the implementation of the heat sink of FIG. 9.

Referring to FIGS. 11 and 12, an opening 236 through the enclosure 220 is defined by opposing inner surfaces in the cold plate 222, e.g., at a left side, and by opposing inner surfaces of the proximal panel 230 and the distal panel 232. The opening 236 may allow air to flow through the enclosure 220 and over the cold plate 222.

Figure 13:
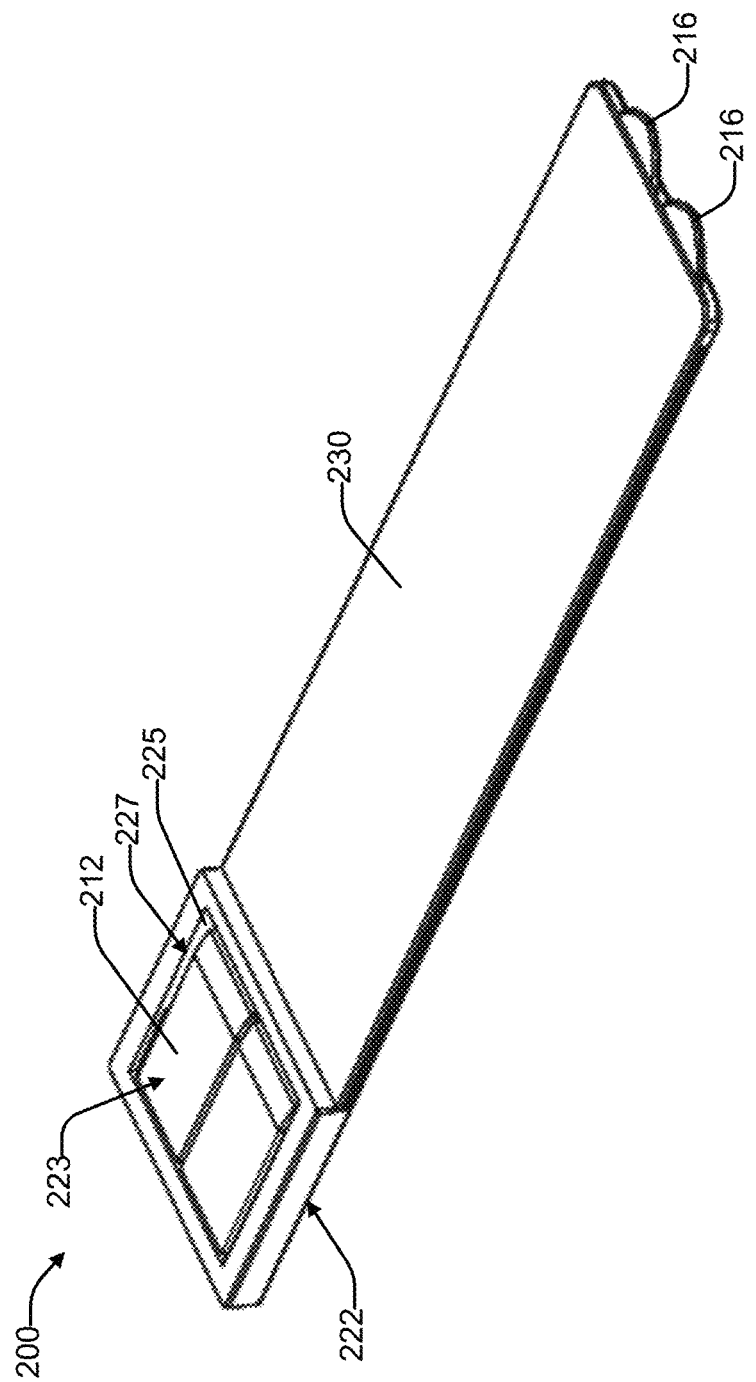
FIG. 13 is a bottom right perspective view of the implementation of the heat sink of FIG. 9.
Figure 17:
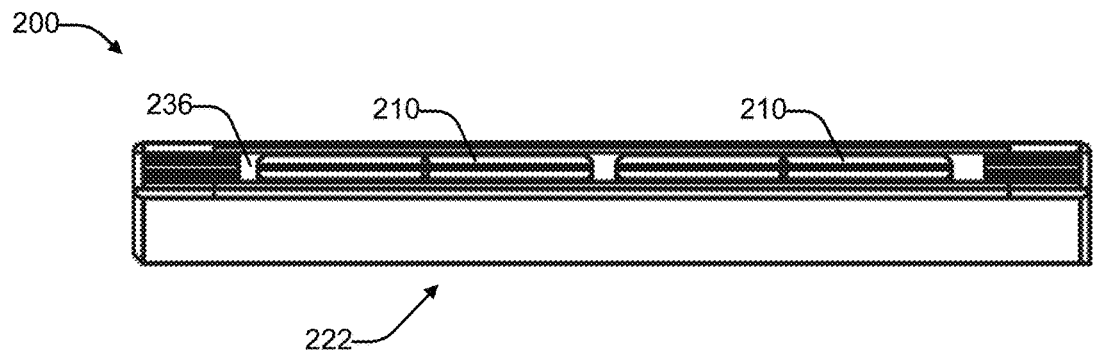
FIG. 17 is a left side view of the implementation of the heat sink of FIG. 9.
Figure 18:
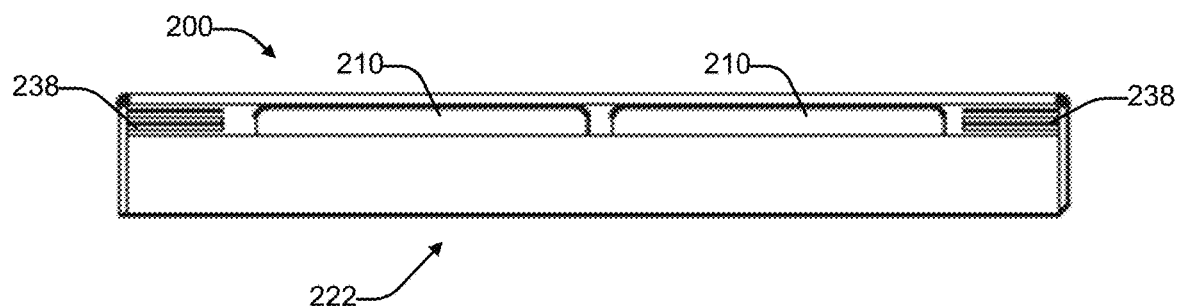
FIG. 18 is a right side view of the implementation of the heat sink of FIG. 9.

Referring to FIG. 13, the contact surface 223 of the base 212 is visible. As illustrated, the cold plate 222 of the enclosure 220 may form a box around the base 212 including internal walls 225 defining a rectangular opening 227 where the base 212 contacts the SoC 130. Accordingly, both the cold plate 222 and the base 212 may contact the SoC 130.

Figure 19:
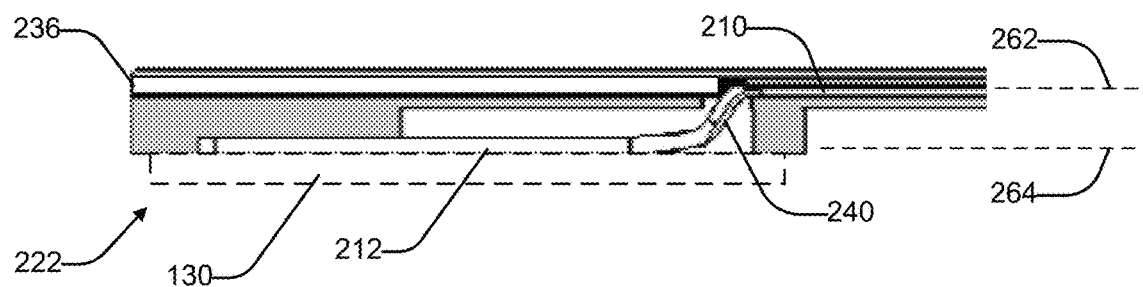
FIG. 19 is a partial cut-away front view of a left side the implementation of the heat sink of FIG. 9.

Referring to FIG. 19, the cold plate 222 includes the base 212 and the connection to the heat transfer members 210 extending from the base 212. In an implementation, for example, the heat transfer members 210 may include a connector portion 240, e.g., a flange or a bend, at an end proximate the base 212 to space apart a first longitudinal axis 262 of the heat transfer members 210 from a second longitudinal axis 264 of the base 212, and hence from a plane of a surface of the SoC 130, which may improve thermal transfer. In particular, in one example implementation, the connector portion 240 may have an arcuate or S-shape (as illustrated) configuration, an angled configuration, a normal direction configuration, or any other configuration or shape that enables the heat transfer members 210 to be spaced apart from the base 212 (and, hence, the SoC 130) in a direction normal to the circuit board heat transfer member while extending away from the base 212 parallel to and along the length of the circuit board.

Decoupling the heat transfer members 210 from the enclosure 220 uses a relative thermal resistance of the enclosure 220 to improve cooling efficiency of the heat transfer members 210 and reduce heat soak, as the enclosure 220 acts as a heat transfer baffle and heat sink for the SoC 130 on the package 132. For example, the enclosure 220 may be formed of copper having a lower thermal conductivity than the heat transfer members 210. The enclosure 220 may be formed as two or more components (e.g., top and bottom) that are placed around the heat transfer members 210 and joined together (e.g., welded). The heat transfer members 210 may contact the enclosure 220 only at the base 212. The heat transfer members 210 may be structurally supported within the enclosure 220 by standoffs 260 (FIG. 11), made from a non-thermally conductive or relatively low thermally conductive material (as compared to the thermal conductivity of the heat transfer members 210) that thermally insulate the heat transfer members 210 from the enclosure 220.

From conduction formula $$Q = k_{eff} A_{eff} \frac{Dt}{Dx};$$

both effective conductivity ($k_{eff}$) and effective area ($A_{eff}$) are increased in the heat sink 200 including the heat transfer members 210 and the enclosure 220. As such, the enclosure 220 may conduct some heat from the SoC 130. Accordingly, decoupling the enclosure 220 from the heat transfer members 210 solves an issue of pre-heat from conduction by allowing the heat transfer members 210 to be in cooler air and allowing airflow through the enclosure 220.

This decoupling allows conduction through the heat transfer members 210 and around the heat-pipes into a stream of airflow, as well as flow through the cold plate 222 of the second heat sink 200. The heat transfer members 210 have a relatively high heat transfer rate to move heat away from the SoC 130 and into the surrounding ambient air, while the enclosure 220 (although having a relatively lower heat transfer rate) allows the turbulent boundary layer of heated air caused by the heat transfer members 210 to mix into the airflow boundary region 224.

One difference between this solution and a traditional heat sink is that, in a traditional fin/base heat sink, pre-heated air that is cooling a component is not pre-heated by the component itself. That is, in a traditional fin/base heat sink, pre-heated air from other components passes through the fins, reducing their ability to cool the component. In contrast, with the example heat sinks 100 and 200, any pre-heating of the air is caused by the component itself, via the heat transfer members 110, 210, and contributes to cooling the component.

One advantage the example heat sinks 100 and 200 is that such heat sinks can be used for multi-heat source boards in confined spaces due to the low profile of the heat sink and low impedance to air flow. In an aspect, features such as fins may be added to create turbulent boundary layers or the heat transfer member may be formed to do so which increases the convective heat transfer rate into the fluid airflow stream surrounding the heat sink while already having a highly conductive heat transfer rate via the heat transfer members.

Figure 20:
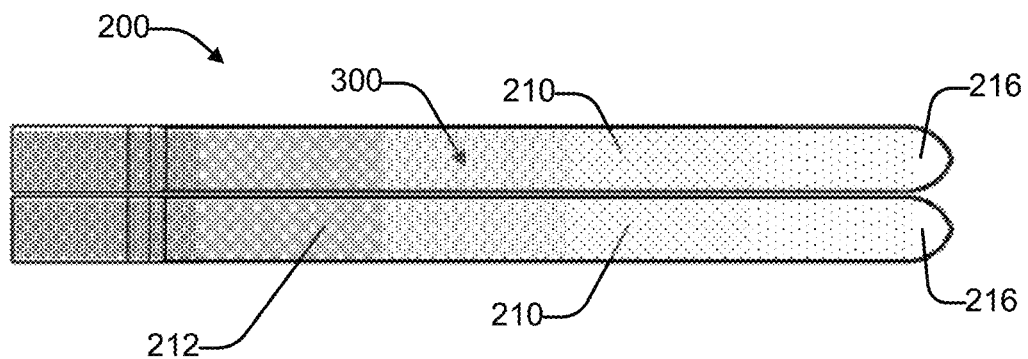
FIG. 20 is a cut-away, top plan view of the implementation of the heat sink of FIG. 2, including representations of heat conduction via the heat transfer members.
Figure 21:
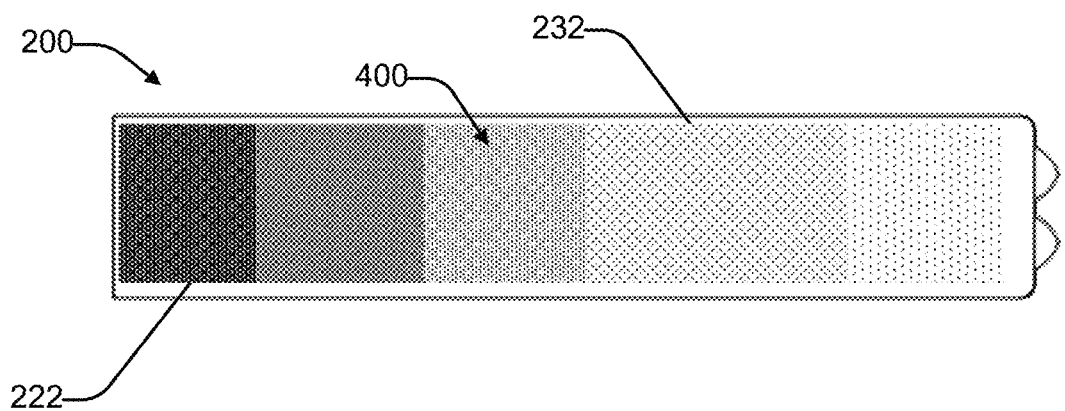
FIG. 21 is a top plan view of the implementation of the heat sink of FIG. 2, including representations of heat conduction in the enclosure.

Referring to FIGS. 20 and 21, example heat conduction profiles 300 and 400 provide an example of the manner heat transfer in each of the heat transfer members 210 and the enclosure 220, respectively. In particular, referring to FIG. 20, the heat conduction profile 300 represents heat conduction via the heat transfer members 210. Similar conduction may occur with the heat transfer members 110. Generally, the heat is conducted from the base 212 along a length of the heat transfer members 110 to an end 216. As discussed above, heat dissipates from the heat transfer members 210 via convection. Similarly, referring to FIG. 5, the heat conduction profile 400 represents heat conduction in the enclosure 220. Generally, the heat transfer members 210 may have greater thermal conductivity than the enclosure 220. Accordingly, the distal panel 232 may remain relatively cool while the cold plate 222 (FIG. 21) is hotter. Accordingly, cool air flowing in the direction illustrated in FIG. 9, e.g., right-to-left airflow 226, may cool the cold plate 222 due to reduced pre-heating due to the enclosure 220.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A heat sink, comprising:
    a base having a first surface in a first plane configured to contact a system on chip (SoC) located on a circuit board;
    a plurality of heat transfer members connected to and extending from the base, wherein the plurality of heat transfer members are configured to extend along a longitudinal length in a second plane having a first spacing from the first plane, and wherein the plurality of heat transfer members respectively include opposing internal walls that define a second spacing between the plurality of heat transfer members; and
    an enclosure at least partially surrounding the plurality of heat transfer members, comprising:
        a proximal panel positioned on a first side of the plurality of heat transfer members and configured to face the circuit board; and
        a distal panel on a second side of the plurality of heat transfer members, wherein the second side is opposite from the first side,
        wherein the proximal panel and the distal panel both longitudinally extend from respective near ends adjacent to the base to respective far ends away from the base, wherein the respective far ends define an opening at an end of the heat transfer members.

2. The heat sink of claim 1, further comprising a plurality of arms each extending from opposite sides of the base, each arm having a shape to define a clip configured to attach with the circuit board.

3. The heat sink of claim 1, wherein the plurality of heat transfer members include a connector portion proximate the base, wherein the connector portion is sized to define the first spacing between the second plane of the plurality of heat transfer members and the first plane of the first surface of the base.

4. The heat sink of claim 3, wherein the connector portion is bent at an inflection point.

5. The heat sink of claim 1, wherein the first surface of the base has a first surface area greater than a second surface area of a corresponding surface of the SoC.

6. The heat sink of claim 1, further comprising a thermal adhesive configured to attach the base to the SoC.

7. The heat sink of claim 1, wherein the enclosure includes a base plate that contacts the base at a second surface opposite the first surface of the base.

8. The heat sink of claim 1, wherein the enclosure includes one or more internal side walls that define one or more side vents between the proximal panel and the distal panel.

9. The heat sink of claim 1, wherein the plurality of heat transfer members have a greater heat conductivity than the enclosure.

10. A computer system, comprising:
a printed circuit board including a system on chip (SoC) and at least one additional component;
a heat sink including a base attached to a surface of the SoC in a first plane, the heat sink further including a plurality of heat transfer members connected to and extending from the base, wherein the plurality of heat transfer members are configured to extend along a longitudinal length in a second plane having a first spacing from the first plane, and wherein the plurality of heat transfer members respectively include opposing internal walls that define a second spacing between the plurality of heat transfer members; and
an enclosure at least partially surrounding the plurality of heat transfer members, comprising:
  a proximal panel positioned on a first side of the plurality of heat transfer members and configured to face the printed circuit board; and
  a distal panel on a second side of the plurality of heat transfer members, wherein the second side is opposite from the first side,
wherein the proximal panel and the distal panel both longitudinally extend from respective near ends adjacent to the base to respective far ends away from the base, wherein the respective far ends define an opening at an end of the heat transfer members.

11. The computer system of claim 10, further comprising an air source configured to move air from an end of the plurality of heat transfer members toward the SoC.

12. The computer system of claim 10, wherein the printed circuit board is a memory microcontroller card.

13. The computer system of claim 10, wherein the plurality of heat transfer members include a connector portion proximate the base, wherein the connector portion is sized to define the first spacing between the second plane of the plurality of heat transfer members and the first plane of the first surface of the base.

14. The computer system of claim 10, wherein the first surface of the base has a first surface area greater than a second surface area of a corresponding surface of the SoC.

15. The computer system of claim 10, wherein the enclosure includes a base plate that contacts the base at a second surface opposite the first surface of the base.

16. The computer system of claim 10, wherein the enclosure includes one or more internal side walls that define one or more side vents between the proximal panel and the distal panel.

* * * * *